US 7,944,696 B2

(12) United States Patent
Sano

(10) Patent No.: US 7,944,696 B2
(45) Date of Patent: May 17, 2011

(54) ELECTRONIC APPARATUS

(75) Inventor: Tetsuo Sano, Kobe (JP)

(73) Assignee: Fujitsu Ten Limited, Kobe-shi (JP)

(*) Notice: Subject to any disclaimer, the term of this patent is extended or adjusted under 35 U.S.C. 154(b) by 112 days.

(21) Appl. No.: 12/385,404

(22) Filed: Apr. 7, 2009

(65) Prior Publication Data
US 2009/0257194 A1 Oct. 15, 2009

(30) Foreign Application Priority Data

Apr. 10, 2008 (JP) ................................ 2008-102864

(51) Int. Cl.
*H05K 7/20* (2006.01)
(52) U.S. Cl. .................... 361/704; 361/600; 361/690
(58) Field of Classification Search .................. None
See application file for complete search history.

(56) References Cited

U.S. PATENT DOCUMENTS

| 5,381,314 | A | * | 1/1995 | Rudy et al. ................. 361/712 |
| 5,946,193 | A | * | 8/1999 | Hendrix et al. ............. 361/704 |
| 6,038,129 | A | * | 3/2000 | Falaki et al. ................ 361/699 |
| 6,374,912 | B1 | * | 4/2002 | LaGrotta et al. ............ 165/185 |
| 7,679,906 | B2 | * | 3/2010 | Fong et al. ................. 361/695 |
| 7,733,647 | B2 | * | 6/2010 | Lee .......................... 361/690 |
| 7,782,618 | B2 | * | 8/2010 | Hata et al. ................. 361/704 |
| 2009/0059534 | A1 | * | 3/2009 | Hata et al. ................. 361/709 |

FOREIGN PATENT DOCUMENTS

| JP | A-9-321458 | 12/1997 |
| JP | A-2000-179982 | 6/2000 |
| JP | A-2002-353645 | 12/2002 |
| JP | A-2005-79295 | 3/2005 |

* cited by examiner

*Primary Examiner* — Gregory D Thompson
(74) *Attorney, Agent, or Firm* — Oliff & Berridge, PLC

(57) ABSTRACT

An electronic apparatus includes a chassis and a heat sink. The heat sink forms one side wall of the chassis. The heat sink has inner and outer wall surfaces corresponding to inner and outer surfaces of the chassis. The heat sink has a guide portion guiding a drop of water initially adhered to the heat sink along the outer wall surface of the heat sink.

7 Claims, 6 Drawing Sheets

ELECTRONIC APPARATUS

BACKGROUND OF THE INVENTION

1. Field of the Invention

This invention relates to an electronic apparatus.

2. Description of the Related Art

Conventionally, an electronic apparatus having a heat sink is known. Regarding such an electronic apparatus, a structure for ensuring waterproof property is proposed (see Japanese Laid-open Patent Publication No. 09-321458).

In the structure disclosed in Japanese Laid-open Patent Publication No. 09-321458, a heat sink is arranged closely to a side wall of a chassis. Therefore, the electronic apparatus cannot be reduced in size by a thickness of the side wall of the chassis.

In order to reduce the size of the electronic apparatus, the heat sink may configure one of the side walls of the chassis. This is because one of the conventionally side walls of the chassis can be eliminated.

However, when the heat sink configures one of the side walls of the chassis, drops of water generated by dew condensation or the like may be adhered to the heat sink and then may be infiltrated into the chassis by way of the heat sink. The infiltration of the drops of water into the chassis may cause a failure of the electronic apparatus.

SUMMARY OF THE INVENTION

The present invention has been made in view of the above circumstances and provides an electronic apparatus which has a small size and a good waterproof property.

According to one aspect of the present invention, there is provided an electronic apparatus including a chassis; and a heat sink configuring one of side walls of the chassis, the heat sink having inner and outer wall surfaces corresponding to inner and outer surfaces of the chassis, and the heat sink having a guide portion guiding a drop of water adhered to the heat sink to the outer wall side.

With such a configuration, since the heat sink configures one of the side walls of the chassis, the chassis can be reduced in size. Further, since the heat sink includes the guide portion guiding the drop of the water to the outer wall surface, the chassis is prevented from being infiltrated with the drops of water.

BRIEF DESCRIPTION OF THE DRAWINGS

Exemplary embodiments of the present invention will be described in detail with reference to the following drawings, wherein.

DESCRIPTION OF THE PREFERRED EMBODIMENTS

A description will be given of an embodiment according to the present invention with reference to the drawings.

Figure 1:
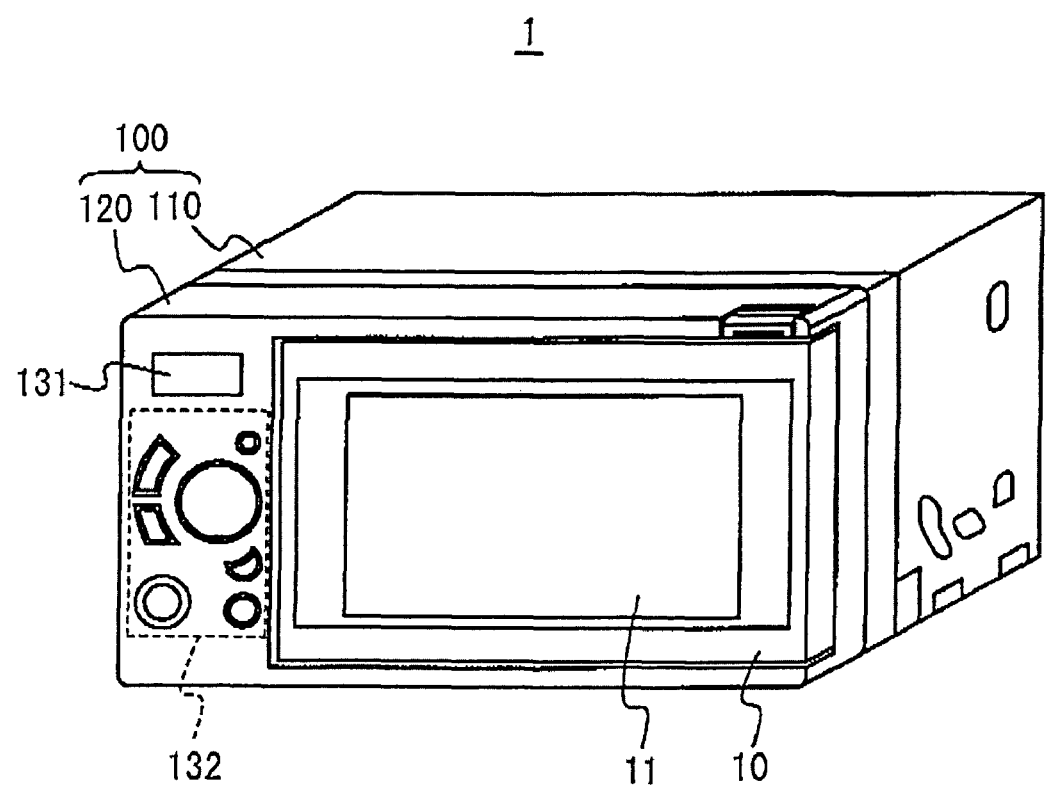
FIG. 1 illustrates an exterior view of an in-vehicle system.

As illustrated in FIG. 1, an in-vehicle system 1 includes: an in-vehicle apparatus 100 (electronic apparatus) built in a vehicle; and a portable apparatus 10 having a navigation function. The portable apparatus 10 can be used with being attached to a front portion 120 of the in-vehicle apparatus 100, and also can be used independently with being detached from the in-vehicle apparatus 100.

The in-vehicle apparatus 100 has functions of outputting radio broadcasting and regenerating audio data and dynamic picture image data written on a storage medium such as a CD (Compact Disk) and a DVD (Digital Versatile Disk). Further, the in-vehicle apparatus 100 includes: a main portion 110 having a player and a loading slot of the storage medium; and the front portion 120 having a display portion 131 and an operational portion 132. The portable apparatus 10 has a navigation function for searching for a navigation path to a destination and displaying the searched navigation path to overlap on map.

Figure 2:
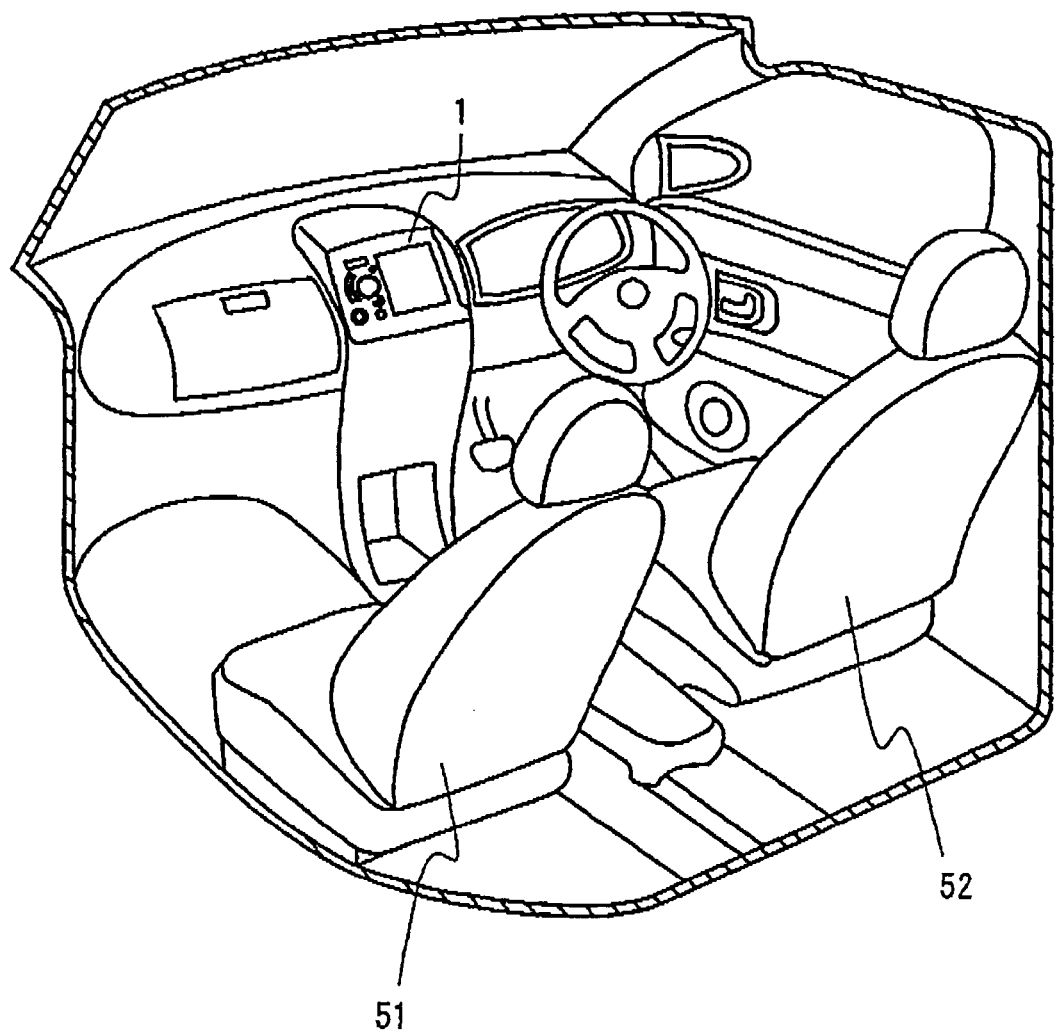
FIG. 2 illustrates an example of the installation of the in-vehicle system into a vehicle.

FIG. 2 illustrates an example of the installation of the in-vehicle system 1 into a vehicle. The in-vehicle system 1 is provided at a dashboard substantially located in the middle of a driver's seat 52 and a passenger's seat 51, as illustrated in FIG. 2.

Figure 3:
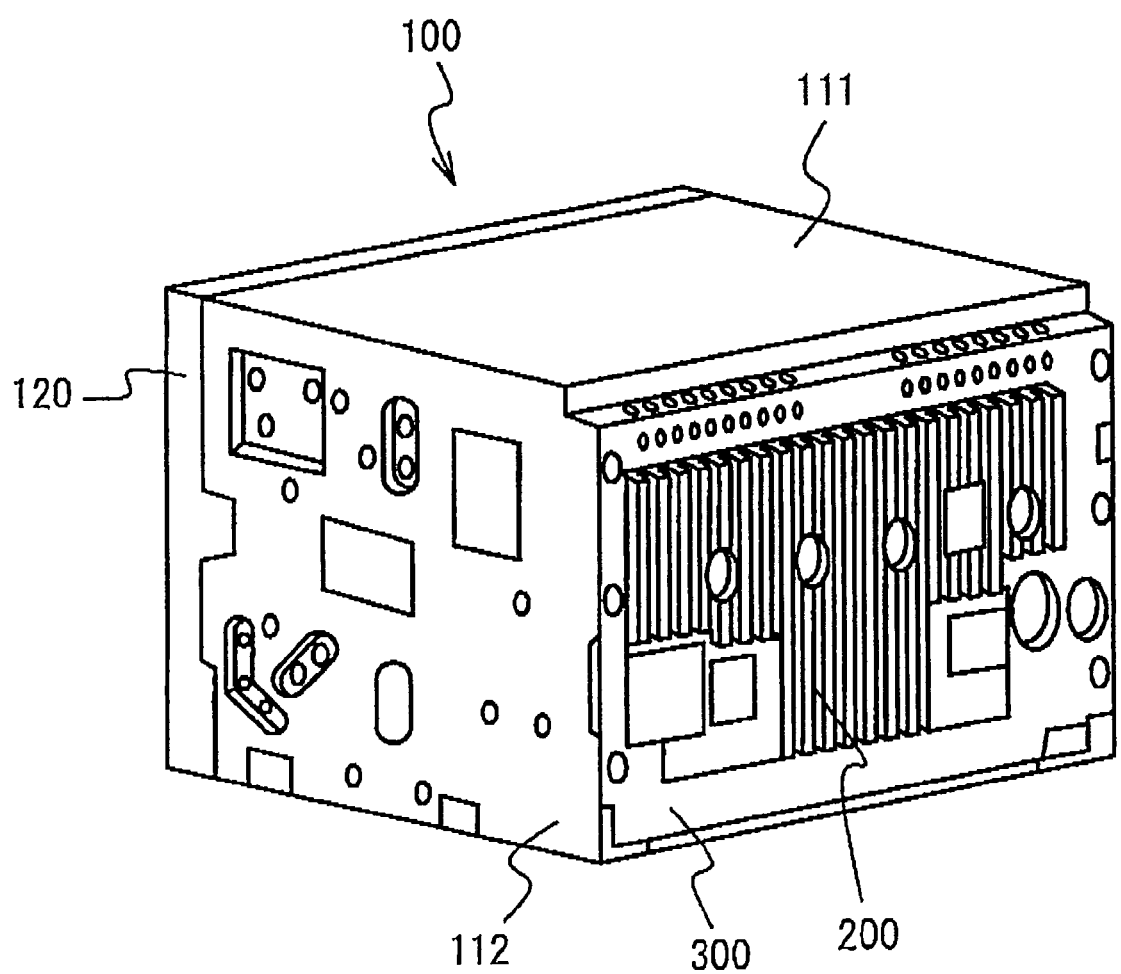
FIG. 3 is a perspective view of an in-vehicle apparatus when viewed from its rear side.

Next, a description will be given of the chassis of the in-vehicle apparatus 100. FIG. 3 is a perspective view of the in-vehicle apparatus 100 when viewed from its rear side. Referring to FIG. 3, the chassis of the in-vehicle apparatus 100 is defined by a top plate 111, a side plate 112, a heat sink 200, and the like. The heat sink 200 is configured as a rear side wall of the chassis of the in-vehicle apparatus 100. The heat sink 200 is also served as a rear side plate, so that the chassis of the in-vehicle apparatus 100 is reduced in size. The heat sink 200 is connected to the top plate 111 by a frame plate 300. The heat sink 200 is made of a thermally high-conductive material such as aluminum or copper. The frame plate 300 is made of a metal.

Figure 4:
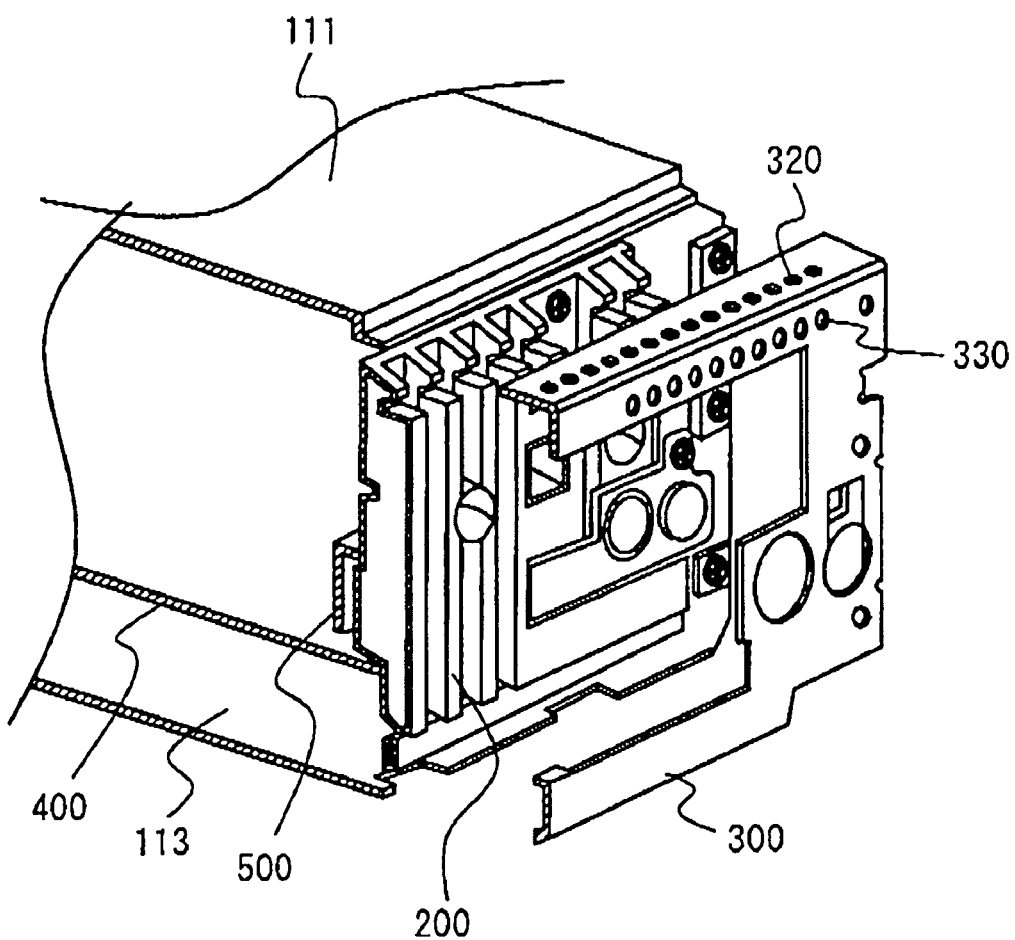
FIG. 4 is a cross-sectional perspective view of the in-vehicle apparatus from which a frame plate is removed.

FIG. 4 is a cross-sectional perspective view of the in-vehicle apparatus 100 from which the frame plate 300 is removed. Further, FIG. 4 simply illustrates an internal structure of the in-vehicle apparatus 100. As illustrated in FIG. 4, the heat sink 200 is mounted on a substrate 400 housed within the chassis. Further, a heater element 500 is mounted on the substrate 400. The heater element 500 is arranged to be closely contact with the heat sink 200. The heat sink 200 dissipates heat of the heater element 500. In addition, electronic components, not illustrated, are mounted on the substrate 400.

The frame plate 300 is provided with plural holes 320 and 330 for improving the efficiency of dissipating heat of the heat sink 200. The frame plate 300 connects the heat sink 200 with the top plate 111 and a bottom plate 113 with covering an outer edge of the heat sink 200. The frame plate 300 corresponds to a plate member covering the heat sink 200. Further, an upper portion of the frame plate 300 has a substantially L-shaped cross section, and is provided with the plural holes 320 and 330. The plural holes 320 are aligned in the lateral direction of the frame plate 300. Similarly, the holes 330 are aligned in the lateral direction of the frame plate 300. The holes 320 and 330 will be described later.

Figure 5:
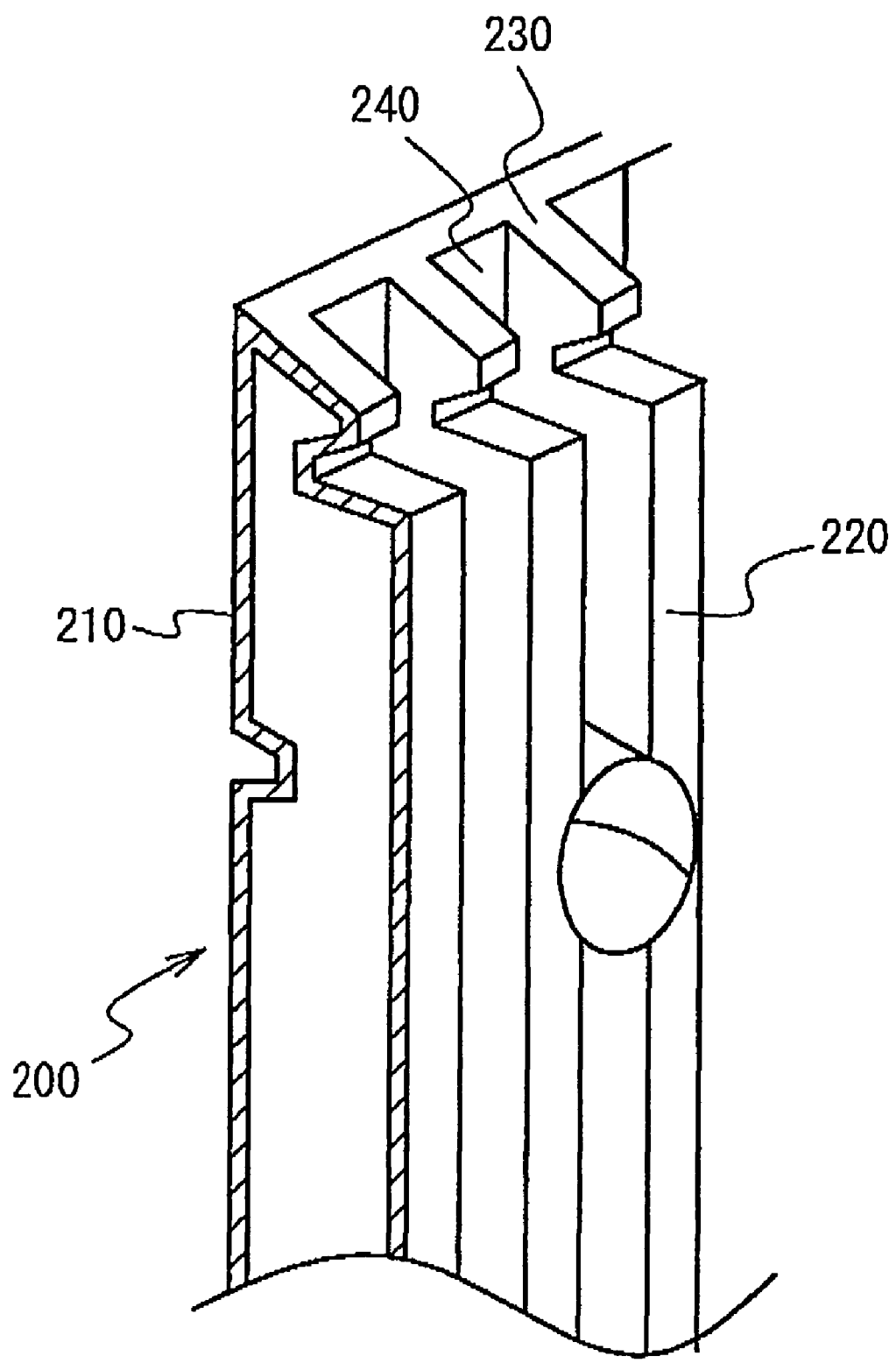
FIG. 5 is an enlarged perspective view of a heat sink.

FIG. 5 is an enlarged perspective view of the heat sink 200. The heat sink 200 includes: an inner wall surface 210 corresponding to an inner surface of the chassis; and an outer wall surface 220 corresponding to an outer surface of the chassis. Further, the upper portion of the heat sink 200 is provided with an inclined surface 230. The inclined surface 230 is downwardly inclined toward the outside of the chassis. Additionally, the outer wall surface 220 is provided with plural channels 240 extending in a longitudinal direction.

For example, when a drop of water is adhered to the inclined surface 230 due to dew condensation or the like, the inclined surface 230 is downwardly inclined toward the outside of the chassis, thereby moving down the drop of water on the outer wall surface 220. In this manner, the inclined surface 230 corresponds to a guide portion for guiding the drops of water adhered to the heat sink 200 to the outer wall surface 220. This prevents the drops of water from moving down on the inner wall surface 210 and thus infiltrating into the chassis.

Additionally, the drop of water moved into the channels 240 is suppressed from coming out of the channels 240, and thus moving downwardly within the channels 240. Such channels 240 prevents the drop of water adhered to the heat sink 200 from moving to the inner wall surface 210 side. Additionally, the provision of the channels 240 allows increase in the surface area of the heat sink 200, so that the efficiency of dissipating heat of the heat sink 200 is also improved.

Next, a description will be given of the holes 320 and 330 provided in the frame plate 300. As illustrated in FIG. 4, when the frame plate 300 is attached to the heat sink 200, the holes 320 are located at an upper side of the inclined surface 230 and face the inclined surface 230. At this time, the hole 330 is located at a front side of the inclined surface 230 and faces the inclined surface 230. In this manner, the plural holes 320 and 330 are provided in the frame plate 300 in order to improve the efficiency of dissipating heat of the heat sink 200. Further, the number of the holes 320 corresponds to that of the channels 240. Similarly, the number of the holes 330 corresponds to that of the channels 240.

Regarding a conventional heat sink not provided with the inclined surface 230 at its upper portion, if plural-holes are provided at the upper portion of the frame plate, a drop of water may be infiltrated into the chassis via the holes. However, the heat sink 200 according to the present embodiment is provided with the inclined surface 230 at its upper portion. This allows the drop of water adhered to the heat sink 200 to be guided to the outer wall surface 220 side via the holes 320 and 330. Therefore, the waterproof property of the in-vehicle apparatus 100 is improved. In particular, when the vehicle runs up a slope, the in-vehicle apparatus 100 is inclined such that the rear side of the chassis is directed upwardly, so that the drop of water may be infiltrated into the chassis with ease. However, even when this state is kept, the infiltration of the drop of water is suppressed.

Figure 6:
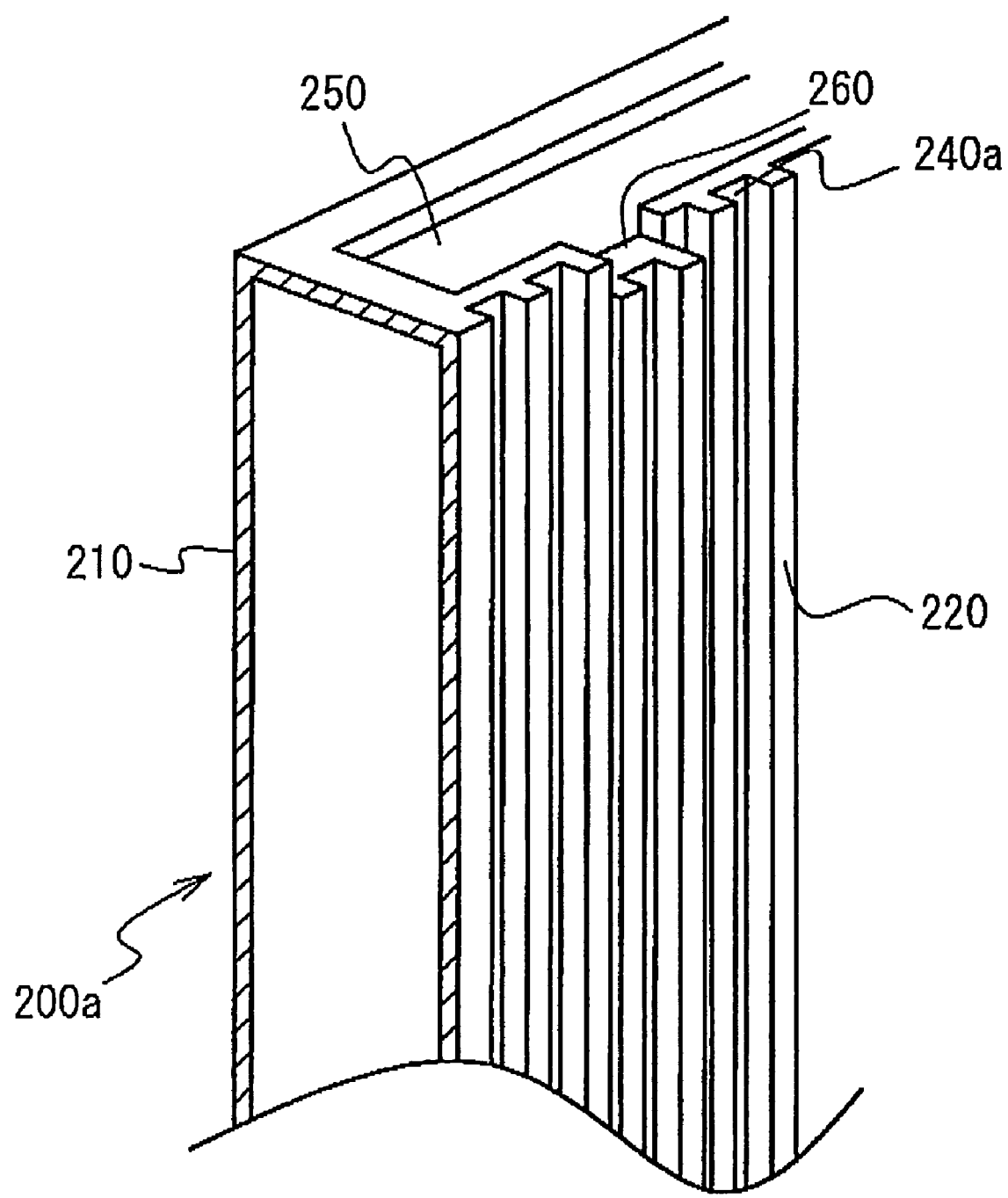
FIG. 6 is an enlarged perspective view of a heat sink according to a variation.

Next, a description will be given of a variation of the heat sink. FIG. 6 is an enlarged perspective view of a heat sink 200a according to a variation. In addition, in the heat sink 200a according to the variation, similar components as the above-described heat sink 200 are denoted by similar reference numerals to avoid a duplication explanation. Further, FIG. 6 corresponds to FIG. 5.

Referring now to FIG. 6, the heat sink 200a is provided with a recess portion 250 at its upper portion. The recess portion 250 has a channel shape extending on the upper portion of the heat sink 200a. The recess portion 250 is provided for storing the drops of water. Additionally, in the upper portion of the heat sink 200a, an outlet 260 is provided for discharging the drop of water stored in the recess portion 250 to the outer wall surface 220 side. For example, the drop of water, which has moved to the heat sink 200a side via the holes 320, is once stored in the recess portion 250, and then discharged via the outlet 260. The drop of water discharged via the outlet 260 moves down on channels 240a. In this way, the recess portion 250 and the outlet 260 correspond to a guide portion. This prevents the drop of water adhered to the heat sink 200a from being moved on the inner wall surface 210 side and being infiltrated into the chassis.

Although a few specific exemplary embodiments employed in the present invention have been shown and described, it would be appreciated by those skilled in the art that changes may be made in these exemplary embodiments without departing from the principles and spirit of the invention, the scope of which is defined in the claims and their equivalents.

The present invention may be arbitrarily employed in an apparatus, having a heat sink for dissipating heat, such as a personal computer or another electronic apparatus, in addition to an in-vehicle apparatus.

The cross sectional shapes of the channels 240 and 240a may be any one of a substantially U shape and substantially V shape. A bottom surface of the recess portion 250 may be inclined to the outlet 260 in order to aid in discharging the drop of water stored in the recess portion 250 via the outlet 260. The present invention is not limited to the heat sink that configures the rear side wall of the chassis, and may configure a side wall.

The present invention is based on Japanese Patent Application No. 2008-102864 filed on Apr. 10, 2008, the entire disclosure of which is hereby incorporated by reference.

What is claimed is:

1. An electronic apparatus comprising;
    a chassis;
    a heat sink corresponding one of side walls of the chassis, the heat sink having inner and outer wall surfaces corresponding to inner and outer surfaces of the chassis, and the heat sink having a guide portion provided on the outer wall surface, the guide portion guiding a drop of water adhered to the outer wall surface away from the inner wall surface; and
    a plate member provided with a hole facing the guide portion, the plate member partially covering the heat sink.

2. The electronic apparatus of claim 1, wherein the guide portion includes an inclined surface downwardly inclined toward an outer side of the chassis.

3. The electronic apparatus of claim 1, wherein the guide portion includes a recess portion for storing the drop of water, and an outlet for discharging the drop of water stored in the recess portion to the outer wall surface side.

4. The electronic apparatus of claim 2, wherein the outer wall surface of the heat sink includes a channel portion for downwardly guiding the drop of water on the inclined surface.

5. The electronic apparatus of claim 3, wherein the outer wall surface of the heat sink includes a channel portion for downwardly guiding the drop of water discharged from the outlet.

6. The electronic apparatus of claim 1, wherein the guide portion is provided at an upper side of the heat sink.

7. The electronic apparatus of claim 1, wherein a portable apparatus is detachably held in the electronic apparatus.

* * * * *